United States Patent
Lim et al.

(10) Patent No.: US 8,896,801 B2
(45) Date of Patent: Nov. 25, 2014

(54) LIQUID CRYSTAL DISPLAY AND MANUFACTURING METHOD THEREOF

(71) Applicant: Samsung Display Co., Ltd., Yongin, Gyeonggi-do (KR)

(72) Inventors: Jae Keun Lim, Suwon-si (KR); Joon-Chul Goh, Hwaseong-si (KR); Se Hyoung Cho, Seoul (KR); Chong Chul Chai, Seoul (KR)

(73) Assignee: Samsung Display Co., Ltd. (KR)

( * ) Notice: Subject to any disclaimer, the term of this patent is extended or adjusted under 35 U.S.C. 154(b) by 185 days.

(21) Appl. No.: 13/677,187

(22) Filed: Nov. 14, 2012

(65) Prior Publication Data
US 2014/0009709 A1    Jan. 9, 2014

(30) Foreign Application Priority Data
Jul. 6, 2012   (KR) .................. 10-2012-0073957

(51) Int. Cl.
  *G02F 1/1339*   (2006.01)
  *G02F 1/1362*   (2006.01)
  *H01L 33/00*    (2010.01)
(52) U.S. Cl.
  CPC ........ *G02F 1/136286* (2013.01); *H01L 33/005* (2013.01)
  USPC .......................................... 349/154; 349/156
(58) Field of Classification Search
  USPC ................................. 349/154, 156
  See application file for complete search history.

(56) References Cited

U.S. PATENT DOCUMENTS

| | | | |
|---|---|---|---|
| 6,469,761 B1 | 10/2002 | Drabik et al. |
| 6,900,852 B2 | 5/2005 | Okada et al. |
| 7,659,958 B2 | 2/2010 | Kim |
| 7,791,681 B2 | 9/2010 | Kim |
| 7,868,976 B2 | 1/2011 | Lin et al. |
| 2008/0113475 A1 | 5/2008 | Kim et al. |
| 2010/0123868 A1 | 5/2010 | Kim et al. |
| 2011/0297941 A1 | 12/2011 | Zhan et al. |
| 2012/0033001 A1 | 2/2012 | Kim et al. |

FOREIGN PATENT DOCUMENTS

| | | |
|---|---|---|
| JP | 2011-227263 | 11/2011 |
| KR | 10-2003-0057050 | 7/2003 |
| KR | 10-2007-0077245 | 7/2007 |
| KR | 10-2011-075468 | 7/2011 |
| KR | 10-2012-0026880 | 3/2012 |

*Primary Examiner* — Phu Vu
(74) *Attorney, Agent, or Firm* — Innovation Counsel LLP

(57) ABSTRACT

Provided is a liquid crystal display. The liquid crystal display includes: a substrate; a gate line, a common electrode line and a data line formed on the substrate; an insulating layer formed on the gate line, the common electrode line and the data line; a pixel electrode formed on the insulating layer; a microcavity formed on the pixel electrode and including a liquid crystal injection hole; a common electrode formed on the microcavity; a support member formed on the common electrode; and a capping layer formed on the support member and covering the liquid crystal injection hole, in which the common electrode line and the common electrode are connected to each other through a contact hole formed in a passivation layer.

20 Claims, 18 Drawing Sheets

LIQUID CRYSTAL DISPLAY AND MANUFACTURING METHOD THEREOF

CROSS-REFERENCE TO RELATED APPLICATION

This application claims priority to and the benefit of Korean Patent Application No. 10-2012-0073957 filed in the Korean Intellectual Property Office on Jul. 6, 2012, the entire contents of which are incorporated herein by reference.

BACKGROUND OF THE INVENTION (a) Field of the Invention

The present invention relates to a liquid crystal display and a manufacturing method thereof.

(b) Description of the Related Art

A liquid crystal display, which is one of the most common types of flat panel displays currently in use, includes two sheets of panels with field generating electrodes such as a pixel electrode, a common electrode, and the like and a liquid crystal layer interposed therebetween.

By applying an voltage to field generating electrodes in the liquid crystal display, liquid crystal molecules in the liquid crystal display are reoriented, thus images can be displayed by controlling polarization of incident light.

A liquid crystal display having an embedded microcavity (EM) structure is a display device manufactured by forming a sacrificial layer with a photoresist, coating a support member thereon, removing the sacrificial layer by an ashing process, and injecting a liquid crystal in an empty space formed by removing the sacrificial layer.

In the liquid crystal display having the EM structure, forming a hole for injection of liquid crystal and patterning of a common electrode may be performed at the same time. In order to reduce a possible delay of the common electrode, a shield electrode is formed to be overlapped with the data line, and the common electrode formed on the sacrificial layer may be in contact with the shield electrode. However, this structure causes a problem of crosstalk between the common electrode and the data line.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a liquid crystal display having advantages of preventing delay and crosstalk of a common electrode and a manufacturing method thereof.

An exemplary embodiment of the present invention provides a liquid crystal display, including: a substrate; a gate line, a common electrode line and a data line formed on the substrate; an insulating layer formed on the gate line, the common electrode line and the data line; a pixel electrode formed on the insulating layer; a microcavity formed on the pixel electrode and including a liquid crystal injection hole; a common electrode formed on the microcavity; a support member formed on the common electrode; and a capping layer formed on the support member and covering the liquid crystal injection hole, in which the common electrode line and the common electrode are connected to each other through a contact hole formed in a passivation layer.

The common electrode line may extend in a parallel to the gate line.

The common electrode line may be formed of a same layer as the gate line.

The microcavity may contain a liquid crystal material.

The microcavity may include a plurality of regions corresponding to each pixel region, and grooves may be formed between the plurality of regions of the microcavity, and the capping layer may cover the grooves.

The grooves may extend parallel to the gate line.

The insulating layer may include an inorganic layer and an organic layer formed on the inorganic layer, and the organic layer may be a color filter.

The common electrode may include an upper common electrode, a lower common electrode, and a connecting part connecting the upper common electrode and the lower common electrode, and the connecting part may be connected to the common electrode line through the contact hole.

The contact hole may be formed at an edge of a pixel.

The contact hole may be formed on an extension line along an extending direction of the data line.

The data line may include a portion that bypasses while surrounding the contact hole.

The pixel electrode may include a first subpixel electrode and a second subpixel electrode, the common electrode line may include a first common electrode line and a second common electrode line, the contact hole may include a first contact hole and a second contact hole, and the common electrode may include a first common electrode and a second common electrode, the first common electrode line may be formed at an edge of the first subpixel electrode edge and connected with the first common electrode through the first contact hole, and the second common electrode line may be formed at an edge of the second subpixel electrode edge and connected with the second common electrode through the second contact hole.

The liquid crystal display may further include a first drain electrode connected to the first subpixel electrode; a second drain electrode connected to the second subpixel electrode, in which the first drain electrode and the second drain electrode may receive the same voltage through a source electrode connected to the data line.

A voltage applied to the first common electrode through the first common electrode line and a voltage applied to the second common electrode through the second common electrode line may be different from each other.

The voltages applied to the first common electrode and the second common electrode may have pulse shape.

Another exemplary embodiment of the present invention provides a manufacturing method of a liquid crystal display, including: forming a gate line and a common electrode line on a substrate; forming a semiconductor layer on the substrate; forming a data line crossing the gate line on the substrate; forming an insulating layer on the gate line, the common electrode line, the semiconductor layer and the data line; forming a pixel electrode on the insulating layer; forming a sacrificial layer on the pixel electrode; forming a contact hole exposing the common electrode line by patterning the insulating layer; forming a common electrode formed on the sacrificial layer and connected to the common electrode line through the contact hole; forming a support member on the common electrode; forming a microcavity including a liquid crystal injection hole by removing the sacrificial layer; injecting a liquid crystal material into the microcavity; and forming a capping layer on the support member so as to cover the liquid crystal injection hole.

The common electrode line may be formed to be parallel with an extending direction of the gate line.

The grooves may be formed to extend in a parallel direction with the gate line.

The common electrode line may be formed of a same layer as the gate line.

The pixel electrode may include a first subpixel electrode and a second subpixel electrode, the common electrode line may include a first common electrode line and a second common electrode line, the contact hole may include a first contact hole and a second contact hole, and the common electrode may include a first common electrode and a second common electrode, the first common electrode line may be formed at an edge of the first subpixel electrode edge and connected with the first common electrode through the first contact hole, and the second common electrode line may be formed at an edge of the second subpixel electrode edge and connected with the second common electrode through the second contact hole.

According to the exemplary embodiments of the present invention, it is possible to improve a possible delay of a common voltage signal by connecting a common electrode line and a common electrode through a contact hole to apply signals to the common electrode by a pixel unit, and prevent crosstalk generated between the common electrode and the data line by removing a separate shielding electrode overlapped with the data line.

DETAILED DESCRIPTION OF THE EMBODIMENTS

Figure 1:
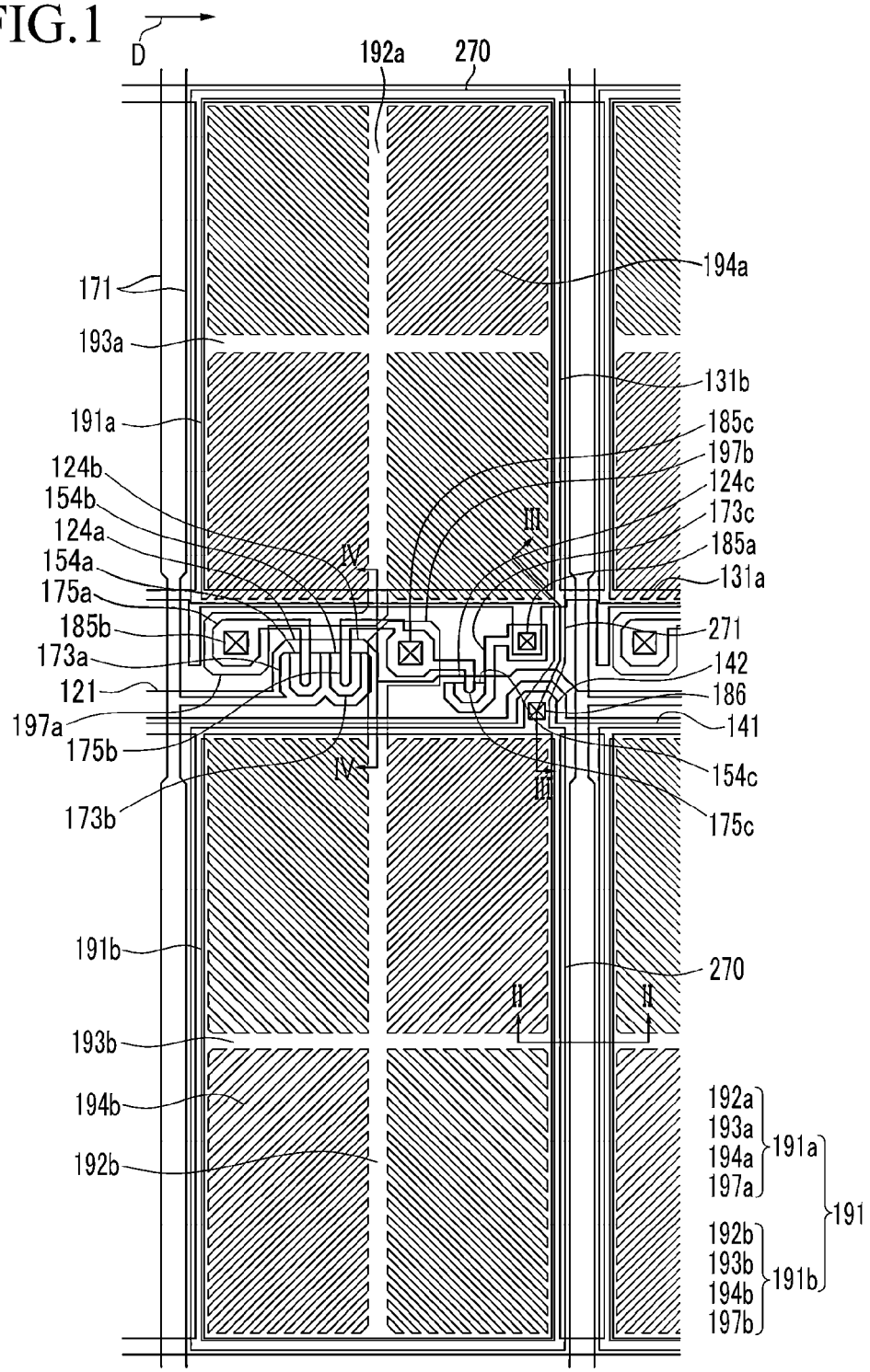
FIG. 1 is a plan view illustrating a liquid crystal display according to an exemplary embodiment of the present invention.

Embodiments of the present invention will be described more fully hereinafter with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening them may also be present. Like reference numerals designate like elements throughout the specification.

Figure 2:
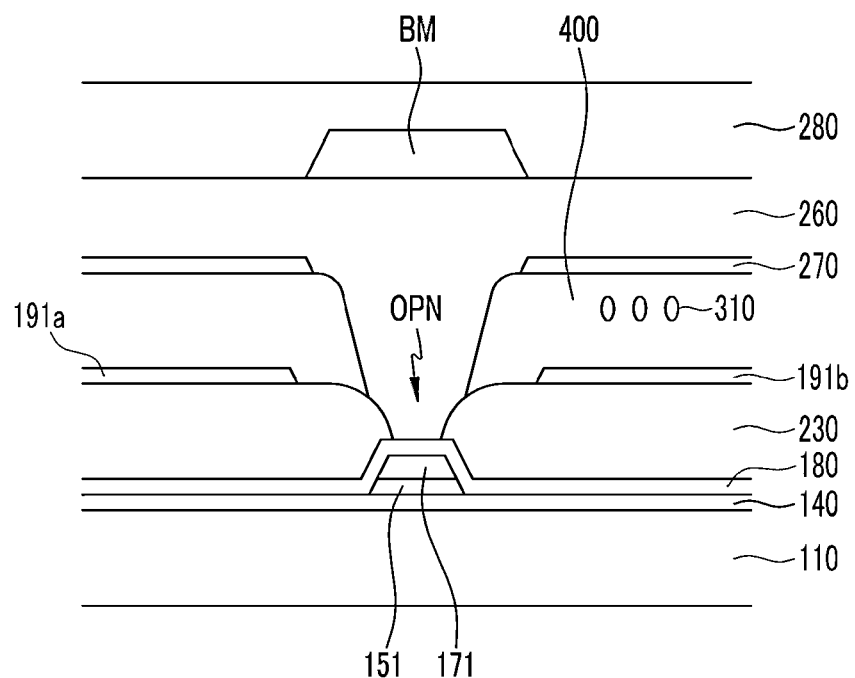
FIG. 2 is a cross-sectional view of FIG. 1 taken along line II-II.
Figure 3:
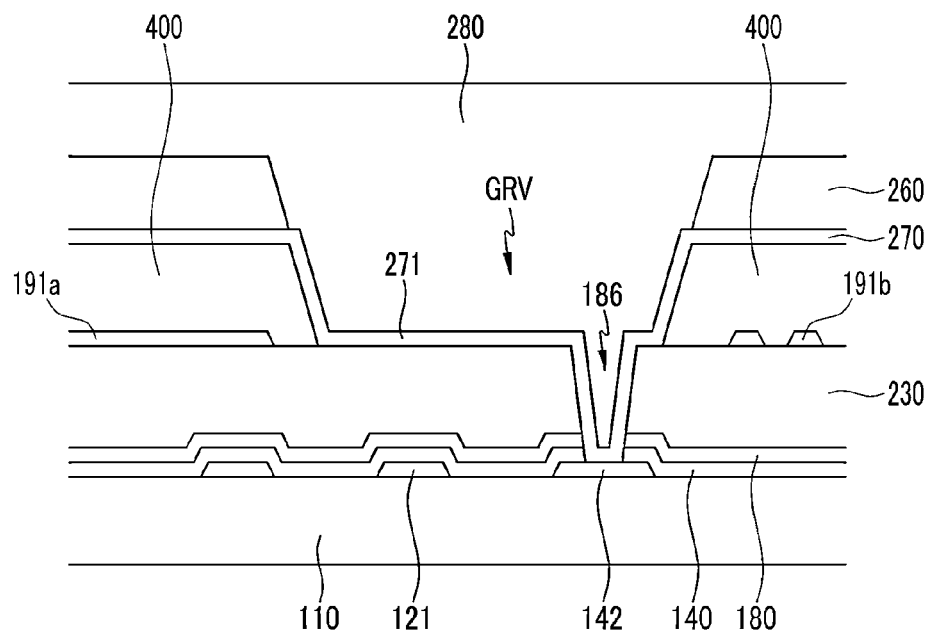
FIG. 3 is a cross-sectional view of FIG. 1 taken along line III-III.
Figure 4:
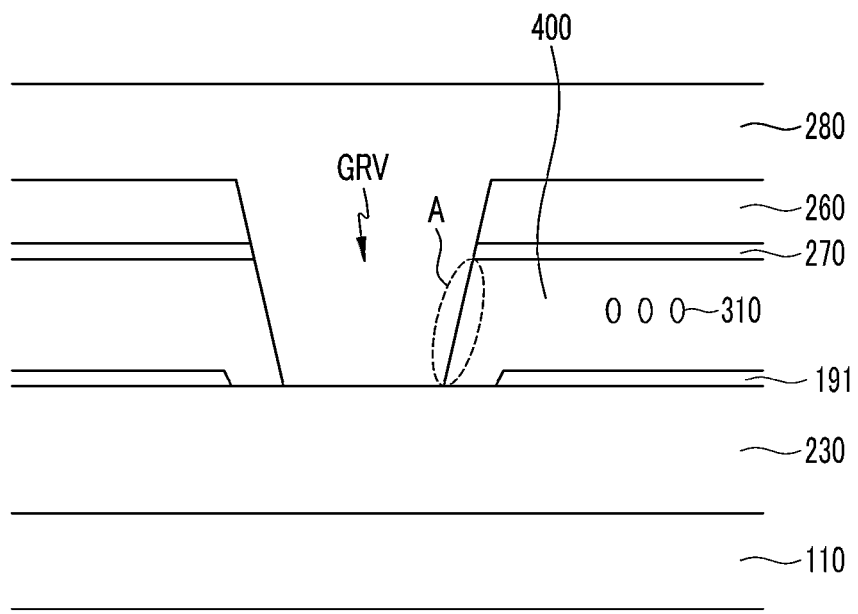
FIG. 4 is a cross-sectional view of FIG. 1 taken along line IV-IV.
Figure 5:
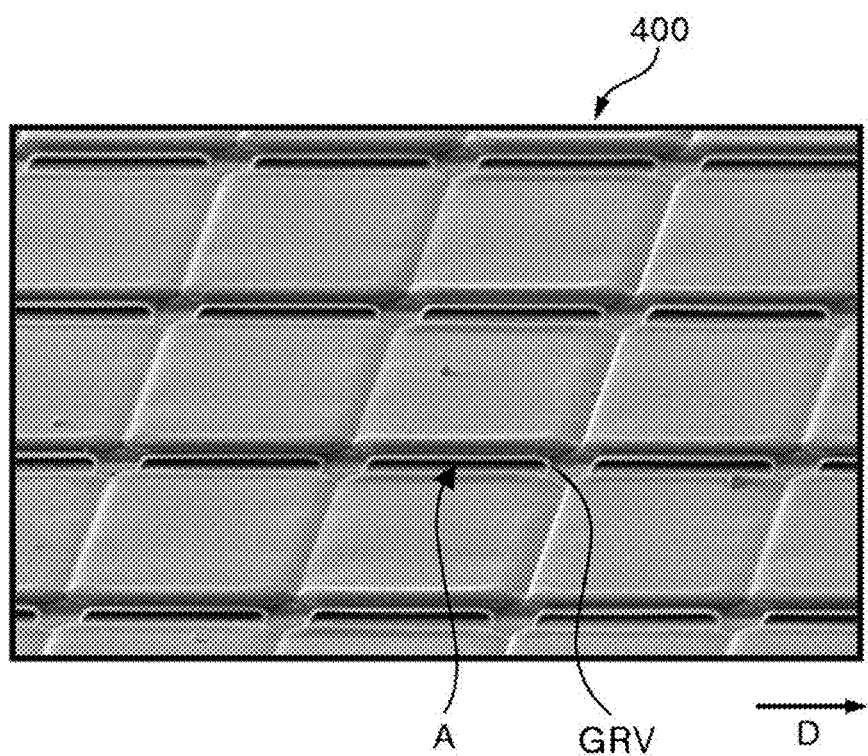
FIG. 5 is a perspective view illustrating a microcavity according to the exemplary embodiment of FIGS. 1 to 4.

FIG. 1 is a plan view illustrating a liquid crystal display according to an exemplary embodiment of the present invention. FIG. 2 is a cross-sectional view of FIG. 1 taken along line II-II. FIG. 3 is a cross-sectional view of FIG. 1 taken along line III-III. FIG. 4 is a cross-sectional view of FIG. 1 taken along line IV-IV. FIG. 5 is a perspective view illustrating a microcavity according to the exemplary embodiment of FIGS. 1 to 4.

Referring to FIGS. 1 to 5, a gate line 121, storage electrode lines 131a and 131b and a common electrode line 141 are formed on a first substrate 110 made of transparent glass or plastic. The common electrode line 141 extends parallel to the gate line 121. The storage electrode lines 131a and 131b include a horizontal portion 131a extending parallel to the gate line 121 and a vertical portion 131b extending from the horizontal portion 131a to a direction crossing the gate line 121. In the exemplary embodiment, the common electrode line 141 and the storage electrode lines 131a and 131b are separated from each other, but the storage electrode lines 131a and 131b and the common electrode line 141 may also be connected to each other.

The gate line 121 transfers a gate signal and mainly extends in a horizontal direction. The gate line 121 includes gate electrodes 124a, 124b, and 124c protruding from the gate line 121. The common electrode line 141 includes a common electrode contact portion 142 protruding from the common electrode line 141.

The gate line 121 and the gate electrodes 124a, 124b, and 124c may be made of at least one selected from the group consisting of aluminum-based metals such as aluminum (Al) and an aluminum alloy, silver-based metals such as silver (Ag) and a silver alloy, and copper-based metals such as copper (Cu) and a copper alloy.

In the exemplary embodiment, the gate line 121 and the gate electrode 124 are formed of a single layer, but are not limited thereto and may be formed of a dual layer or triple layer form.

In the case of the dual-layer structure, the gate line 121 and the gate electrodes 124a and 124b may be formed by a lower layer and an upper layer, and the lower layer may be made of at least one selected from the group consisting of molybdenum-based metals such as molybdenum (Mo) and a molybdenum alloy, chromium (Cr), a chromium alloy, titanium (Ti), a titanium alloy, tantalum (Ta), a tantalum alloy, manganese (Mn), a manganese alloy. The upper layer may be made of at least one selected from the group consisting of aluminum-based metals such as aluminum (Al) and an aluminum alloy, silver-based metals such as silver (Ag) and a silver alloy, and copper-based metals such as copper (Cu) and a copper alloy. In the case of the triple-layer structure, the triple layer may be formed in a combination of layers having different physical properties.

A gate insulating layer 140 is formed on the gate line 121. A first contact hole 185a which connects the storage electrode line 131a and a third source electrode 173c to be described below is formed in the gate insulating layer 140.

Semiconductor layers 154a, 154b, and 154c are formed on the gate insulating layer 140. The semiconductor layer may include a semiconductor stripe 151 which overlaps a data line 171 to be described below.

On the semiconductor layers 154a, 154b, and 154c, data conductors 173a, 173b, 173c, 175a, 175b, and 175c including a data line 171 connected with a first source electrode 173a, a second source electrode 173b connected with the first source electrode 173a, a third source electrode 173c, a first drain electrode 175a, a second drain electrode 175b, and a third drain electrode 175c connected to the second drain electrode 175b are formed.

The first gate electrode 124a, the first source electrode 173a and the first drain electrode 175a form a thin film transistor Qa together with the first semiconductor layer 154a, and a channel of the thin film transistor is formed at the semiconductor portion 154a between the first source electrode 173a and the first drain electrode 175a. Similarly, the second gate electrode 124b, the second source electrode 173b and the second drain electrode 175b form a second thin film transistor Qb together with the second semiconductor layer 154b, and a channel of the thin film transistor is formed at the semiconductor portion 154b between the second source electrode 173b and the second drain electrode 175b. In addition, the third gate electrode 124c, the third source electrode 173c and the third drain electrode 175c form a third thin film transistor Qc together with the third semiconductor layer 154c, and a channel of the thin film transistor is formed at the semiconductor portion 154c between the third source electrode 173c and the third drain electrode 175c.

The data conductors 173a, 173b, 173c, 175a, 175b, and 175c may be made of at least one selected from the group consisting of aluminum-based metals such as aluminum (Al) and an aluminum alloy, silver-based metals such as silver (Ag) and a silver alloy, and copper-based metals such as copper (Cu) and a copper alloy.

In the exemplary embodiment, the data conductors 173a, 173b, 173c, 175a, 175b, and 175c are formed of a single layer, but are not limited thereto and may be formed of a dual layer or triple layer form.

In the case of the dual-layer structure, the data conductors 173a, 173b, 173c, 175a, 175b, and 175c may be formed by a lower layer and an upper layer, and the lower layer may be made of at least one selected from the group consisting of molybdenum-based metals such as molybdenum (Mo) and a molybdenum alloy, chromium (Cr), a chromium alloy, titanium (Ti), a titanium alloy, tantalum (Ta), a tantalum alloy, manganese (Mn), a manganese alloy. In addition, the upper layer may be made of at least one selected from the group consisting of aluminum-based metals such as aluminum (Al) and an aluminum alloy, silver-based metals such as silver (Ag) and a silver alloy, and copper-based metals such as copper (Cu) and a copper alloy. In the case of the triple-layer structure, the triple layer may be formed in a combination of layers having different physical properties.

Although not shown, ohmic contact layers may be formed between the semiconductor layers 154a, 154b, and 154c and the source electrodes 173a, 173b, and 173c, and between the semiconductor layers 154a, 154b, and 154c and the drain electrodes 175a, 175b, and 175c.

A passivation layer 180 is formed on the data conductors 173a, 173b, 173c, 175a, 175b, and 175c and the semiconductor layers 154a, 154b, and 154c. The passivation layer 180 may be made of an inorganic insulator such as silicon nitride and silicon oxide.

As shown in FIG. 3, an organic layer 230 is formed on the passivation layer 180. A second contact hole 186 is formed in the organic layer 230, the passivation layer 180 and the gate insulating layer 140. The second contact hole 186 exposes an upper surface of the common electrode contact portion 142 connected to the common electrode line 141. A common electrode to be described below and the common electrode line 141 are connected to each other through the second contact hole 186.

Further, as shown in FIG. 1, a third contact hole 185b and a fourth contact hole 185c are formed in the organic layer 230 and the passivation layer 180. Although not shown, the third contact hole 185b exposes the first drain electrode 175a, and the fourth contact hole 185c exposes the second drain electrode 175b.

The organic layer 230 may perform planarization and may be a color filter. The organic layer 230 which is formed of the color filter may be elongated in a vertical direction along columns of pixel electrodes 191a and 191b. Each organic layer 230 which is formed of the color filter may display one of primary colors such as three primary colors of red, green and blue. However, the primary colors are not limited to the three primary colors of red, green and blue, and the color filter 230 may be one of a cyan, magenta, yellow and white-based colors.

The pixel electrode 191a and 191b are formed on the organic layer 230. The pixel electrodes 191a and 191b are formed of a first subpixel electrode 191a and a second subpixel electrode 191b. The first subpixel electrode 191a is electrically connected to the first drain electrode 175a through the third contact hole 185b, and the second subpixel electrode 191b is electrically connected to the second drain electrode 175b through the fourth contact hole 185c. Accordingly, the first subpixel electrode 191a and the second subpixel electrode 191b receive data voltages from the first drain electrode 175a and the second drain electrode 175b, respectively. The pixel electrodes 191a and 191b may be made of a transparent conductor such as ITO or IZO.

The first subpixel electrode 191a and the second subpixel electrode 191b are separated from each other with the gate line 121 and the common electrode line 141 therebetween. The first subpixel electrode 191a and the second subpixel electrode 191b are disposed at an upper portion and a lower portion of the pixel respectively and are adjacent to each other in a column direction.

The overall shape of each of the first subpixel electrode 191a and the second subpixel electrode 191b is a quadrangle, and the first subpixel electrode 191a and the second subpixel electrode 191b include cross stems having vertical stems 192a and 192b and horizontal stems 193a and 193b crossing the vertical stems 192a and 192b, respectively. Further, the first subpixel electrode 191a and the second subpixel electrode 191b include a plurality of minute branches 194a and 194b, and a lower protrusion 197a and an upper protrusion 197b, respectively.

The pixel electrode 191 is divided into four sub-regions by the horizontal stems 193a and 193b and the vertical stems 192a and 192b. The minute branches 194a and 194b obliquely extend from the horizontal stems 193a and 193b and the vertical stems 192a and 192b, and the extending direction forms an angle of approximately 45 degrees or 135 degrees with the gate line 121 or the horizontal stems 193a and 193b. Further, directions in which the minute branches 194a and 194b of the two adjacent sub-regions extend may be perpendicular to each other.

A microcavity 400 is formed on the pixel electrode 191. Although not shown, a lower alignment layer is formed on the pixel electrode 191. The alignment layer may be a vertical alignment layer. The lower alignment layer may be formed of materials such as polyamic acid, polysiloxane, polyimide or mixture thereof.

Referring to FIGS. 4 and 5, a liquid crystal material containing liquid crystal molecules 310 is injected into the microcavity 400, and the microcavity 400 has a liquid crystal injection hole A. The microcavity 400 may be formed in a column direction of the pixel electrode 191. In the exemplary embodiment, the liquid crystal material may be injected into the microcavity 400 by using capillary force. Although not shown in FIG. 4, some elements of the gate line 121, the gate insulating layer 140, the semiconductor layer, and the second drain electrode 175b may be formed between the substrate 110 and the organic layer 230 along a line IV-IV of FIG. 1.

The microcavity 400 includes a plurality of regions divided by a plurality of grooves GRV which are formed on the gate line 121. The grooves GRV may be parallel to the gate line 121. The plurality of regions of the microcavity 400 may correspond to each pixel region, and a plurality of microcavities 400 may be formed in a column direction. The plurality of regions of the microcavity 400 may be formed along an extending direction D of the gate line 121. The liquid crystal injection holes A of the microcavity 400 are formed along a region corresponding to a boundary of the groove GRV and the microcavity 400.

The liquid crystal injection holes A may be formed in an extending direction of the grooves GRV. In other words, in FIGS. 4 and 5, the liquid crystal injection holes A may be formed in the extending direction D of the gate line 121. In addition, an open portion OPN which is formed between the adjacent microcavities 400 in the extending direction D of the gate line 121 may be covered by a support member 260 as shown in FIG. 2.

In the exemplary embodiment, the grooves GRV are formed in the extending direction of the gate line 121, but in another exemplary embodiment, the grooves GRV may also be formed in an extending direction of the data line 171. As a result, the plurality of regions of the microcavity 400 is formed along a vertical direction, and the liquid crystal injection holes A may be formed in the extending direction of the data line 171.

A common electrode 270 and a support member 260 are formed on the microcavity 400.

The common electrode 270 receives a common voltage and generates an electric field together with the pixel electrode 191 to which the data voltage is applied to determine tilted directions of the liquid crystal molecules 310 which are in the microcavity 400 between the two electrodes. The common electrode 270 forms a capacitor (hereinafter, referred to as a "liquid crystal capacitor") together with the pixel electrode 191 to maintain the applied voltage to the liquid crystal molecules 310 even after the thin film transistor is turned off.

The common electrode 270 may be made of a transparent conductor such as ITO or IZO.

Although not shown, an overcoat may be formed between the common electrode 270 and the support member 260.

In the exemplary embodiment, the common electrode 270 may be arranged corresponding to each of the subpixel electrodes 191a and 191b. Referring to FIGS. 1 and 2, in the exemplary embodiment, the common electrode 270 is separated from the adjacent common electrodes 270 by the data line 171. In addition, the data line 171 and the common electrode 270 may not be overlapped with each other.

Referring to FIGS. 1 and 3, when the common electrode 270 at a position corresponding to the first subpixel electrode 191a is referred to as an upper common electrode and the common electrode 270 at a position corresponding to the second subpixel electrode 191b is referred to as a lower common electrode, the upper common electrode and the lower common electrode are connected to each other by a connecting part 271. The connecting part 271 is formed on a side wall of the microcavity 400 exposed by the groove GRV and is in contact with a common electrode contact portion 142 of the common electrode line 141 through the second contact hole 186. The common electrode contact portion 142 may be a protruding portion from the common electrode line 141. Accordingly, the common electrode 270 may receive a signal through the common electrode line 141. As described above, according to the exemplary embodiment, since the common electrode line 141 extends in a parallel direction to the gate line 121, and the common electrode contact portion 142 of the common electrode line 141 is formed for each pixel, the common electrode 270 receives the signal for each pixel unit, thereby preventing a delay of a common voltage signal. Further, the data line 171 and the common electrode 270 are not overlapped with each other, such that it is possible to prevent crosstalk between the data lime 171 and the common electrode 270.

A capping layer 280 is formed on the support member 260. The capping layer 280 is in contact with the upper surface and the side wall of the support member 260 and covers the liquid crystal injection hole A of the microcavity 400 exposed by the grooves GRV. The capping layer 280 may be made of a thermosetting resin, silicon oxycarbide (SiOC), or graphene.

A light blocking member BM may be formed between the support member 260 and the capping layer 280. The light blocking member BM is called a black matrix and blocks light leakage. The light blocking member BM may be substantially formed at a portion except for the pixel region.

In the exemplary embodiment, since the liquid crystal material is injected through the liquid crystal injection hole A of the microcavity 400, the liquid crystal display may be formed without a separate upper substrate.

An overcoat (not shown) formed by an inorganic layer or an organic layer may be formed on the capping layer 280. The overcoat protects the liquid crystal molecules 310 injected into the microcavity 400 from an external impact and serves as a planarization layer.

Figure 6:
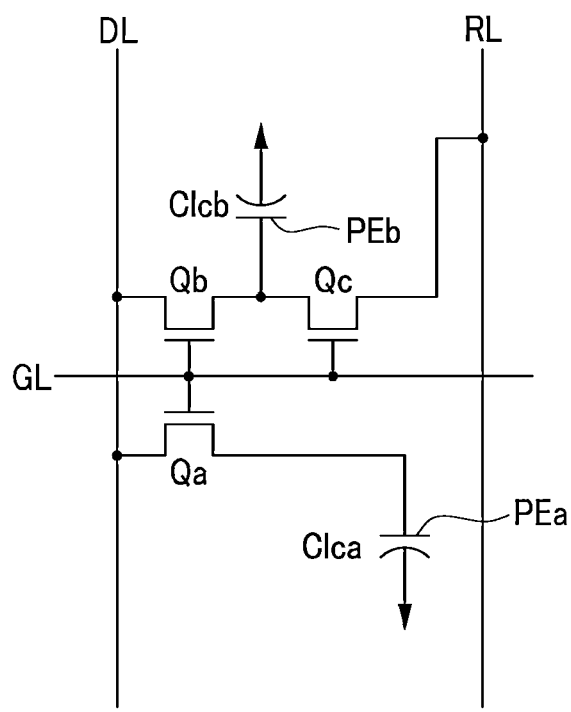
FIG. 6 is an equivalent circuit diagram for one pixel in the display device according to the exemplary embodiment of FIGS. 1 to 4.

FIG. 6 is an equivalent circuit diagram for one pixel in the display device according to the exemplary embodiment of FIGS. 1 to 4.

Referring to FIG. 6, layouts of signal lines and pixels of the liquid crystal display according to the exemplary embodiment of the present invention and an example for a driving method thereof will be described.

Referring to FIG. 6, one pixel PX of the liquid crystal display according to the exemplary embodiment of the present invention includes a plurality of signal lines including a gate line GL transferring a gate signal, a data line DL transferring a data signal, and a reference voltage line RL transferring a divided reference voltage, and a first switching element Qa, a second switching element Qb, a third switching element Qc, a first liquid crystal capacitor Clca and a second liquid crystal capacitor Clcb which are connected to the plurality of signal lines. In the exemplary embodiment of FIGS. 1 to 5 described above, the reference voltage line RL is formed by the storage electrode lines 131a and 131b, and in another exemplary embodiment, a reference voltage line for transferring a divided reference voltage which is separated from the storage electrode line may be formed.

The first switching element Qa and the second switching element Qb are connected to the gate line GL and the data line DL, respectively. The third switching element Qc is connected between an output terminal of the second switching element Qb and the reference voltage line RL.

The first switching element Qa and the second switching element Qb are three-terminal elements such as a thin film transistor, of which control terminals are connected to the gate line GL, input terminals are connected to the data line DL, an output terminal of the first switching element Qa is connected to the sub-pixel electrode which forms an electrode of the first liquid crystal capacitors Clca, and an output terminal of the second switching element Qb is connected to the sub-pixel electrode which forms an electrode of the second liquid crystal capacitor Clcb and an output terminal of the third switching element Qc.

The third switching element Qc is also a three-terminal element such as a thin film transistor, of which a control terminal is connected with the gate line GL, an output terminal is connected to the output terminal of the second second switching element Qb, and an input terminal is connected to the reference voltage line RL.

When a gate-on voltage Von signal is applied to the gate line GL, the first switching element Qa, the second switching element Qb and the third switching element Qc connected thereto are turned on. Accordingly, a data voltage applied to the data line DL is applied to a first electrode PEa and a second electrode PEb through the turned-on first switching element Qa and second switching element Qb, respectively. In this case, the data voltages applied to the first electrode PEa and the second electrode PEb may be charged by the same value. However, according to the exemplary embodiment of the present invention, the voltage applied to the second electrode PEb is divided through the third switching element Qc which is connected to the second switching element Qb in series. Accordingly, the voltage applied to the second electrode PEb becomes lower than the voltage applied to the first electrode PEa.

The layouts of the signal lines and the pixels of the liquid crystal display described above and the driving method thereof correspond to one example and may be modified in other forms.

Figure 7:
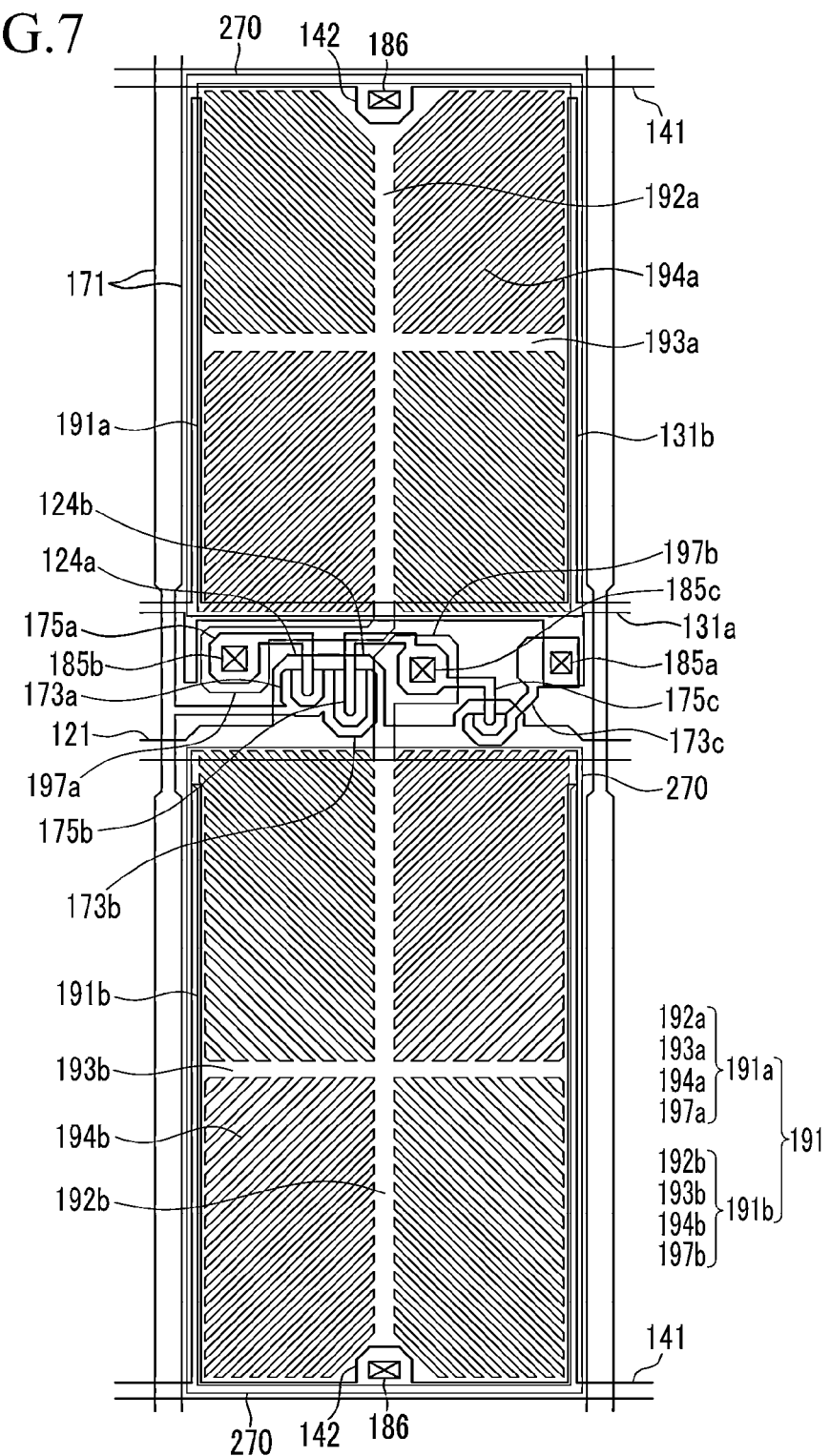
FIG. 7 is a plan view illustrating a liquid crystal display according to an exemplary embodiment of the present invention.

FIG. 7 is a plan view illustrating a liquid crystal display according to an exemplary embodiment of the present invention.

Referring to FIG. 7, elements of the exemplary embodiment are almost the same as the elements of the exemplary embodiment of FIGS. 1 to 5 described above, and hereinafter, differences will be described.

In the exemplary embodiment, the common electrode line 141 and the common electrode contact portion 142 are formed at an edge of the pixel. As shown in FIG. 7, the common electrode line 141 is formed parallel to the gate line 121 along an upper edge of the first subpixel electrode 191a. A contact hole 186 is formed in a gate insulating layer and an organic layer which cover the common electrode line 141, and the common electrode 270 and the common electrode line 141 are connected to each other through the contact hole 186. Here, the common electrode contact portion 142 which protrudes from the common electrode line 141 is formed to be adjacent to an end of the vertical stem 192a of the first subpixel electrode 191a, and the contact hole 186 is formed at a portion overlapped with the common electrode contact portion 142. Similarly, the common electrode line 141 is formed parallel to the gate line 121 along a lower edge of the second subpixel electrode 191b, and the common electrode contact portion 142 is formed to be adjacent to an end of the vertical stem 192b of the second subpixel electrode 191b, and the contact hole 186 is formed at a portion overlapped with the common electrode contact portion 142.

The contents described in FIGS. 1 to 5 may be applied to the exemplary embodiment except for the difference described above.

Figure 8:
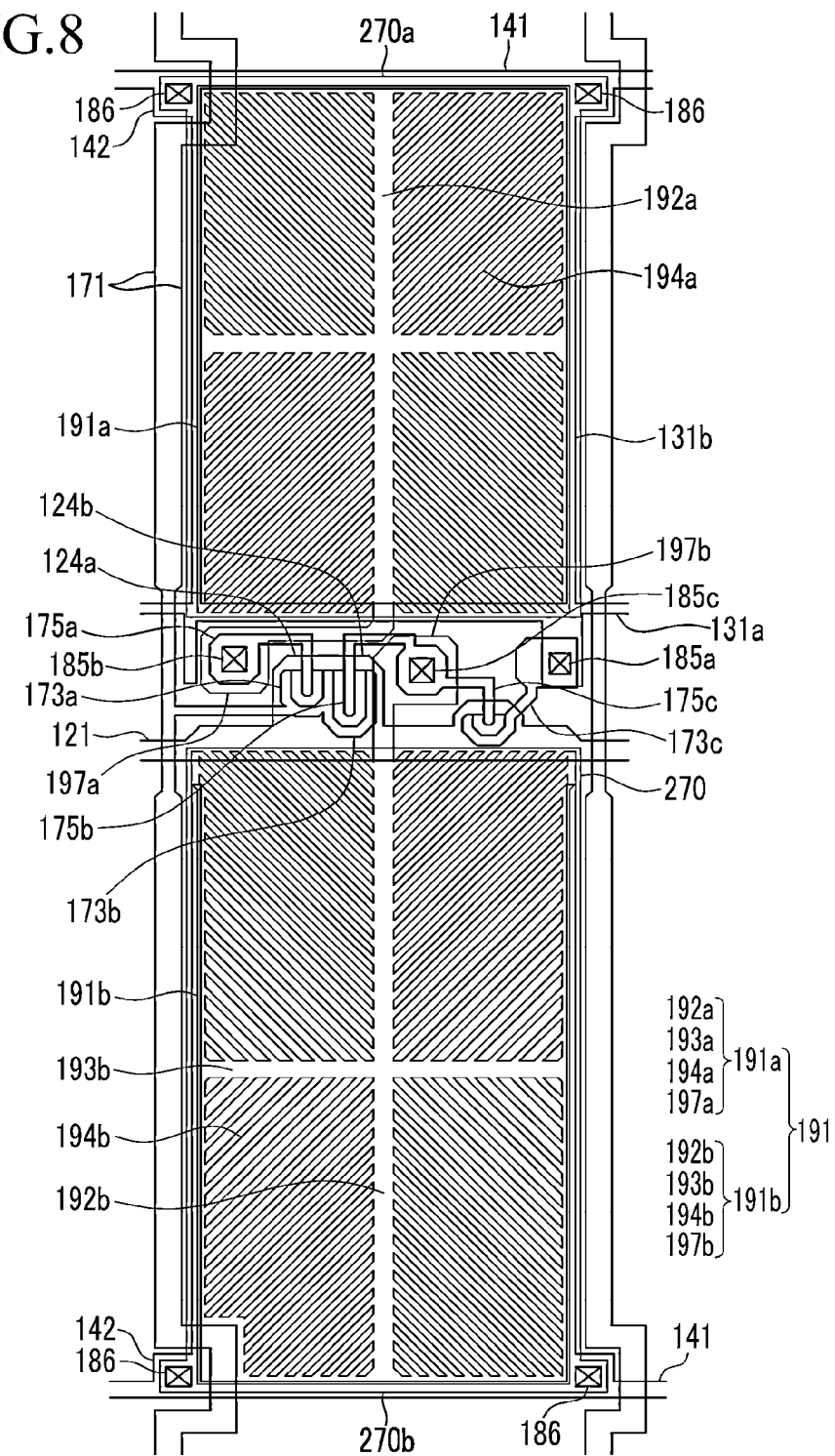
FIG. 8 is a plan view illustrating a liquid crystal display modifying the exemplary embodiment of FIG. 7.

FIG. 8 is a plan view illustrating a liquid crystal display modifying the exemplary embodiment of FIG. 7.

The exemplary embodiment of FIG. 8 has the same element as the exemplary embodiment described in FIG. 7, and hereinafter, differences will be described.

In the exemplary embodiment, like the exemplary embodiment of FIG. 7, the common electrode line 141 and the common electrode contact portion 142 are formed at an edge of the pixel. However, the common electrode contact portion 142 is formed on an extension line of the data line 171 and as a result, the data line 171 bypasses while surrounding a portion where the common electrode contact portion 142 is formed. Accordingly, an upper common electrode 270a and a lower common electrode 270b which are formed corresponding to the first subpixel electrode 191a and the second subpixel electrode 191b may be connected with the common electrode line 141 by two contact holes 186, respectively.

The contents described in FIG. 7 may be applied to the exemplary embodiment except for the difference described above.

Figure 9:
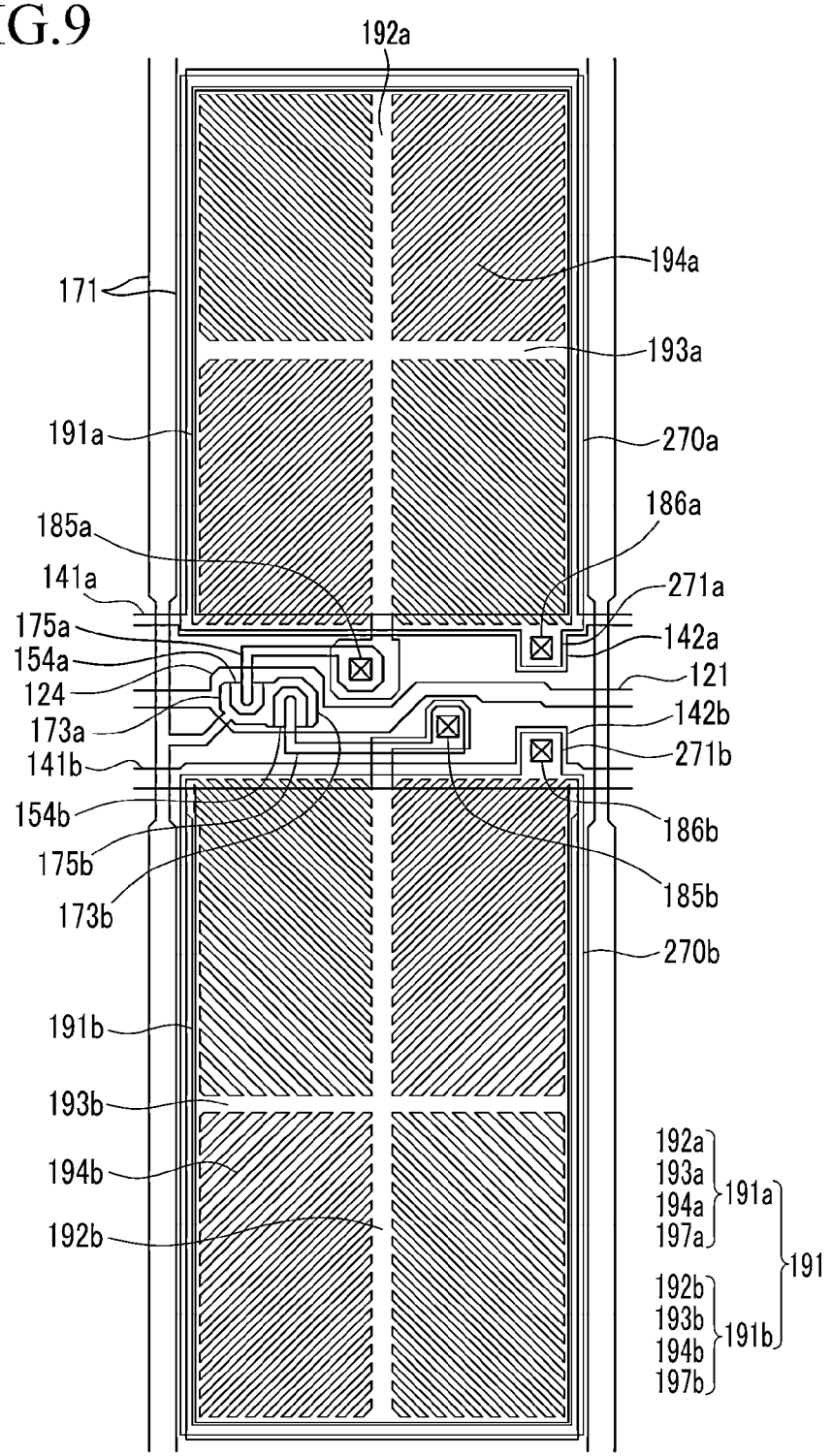
FIG. 9 is a plan view illustrating a liquid crystal display according to an exemplary embodiment of the present invention.
Figure 10:
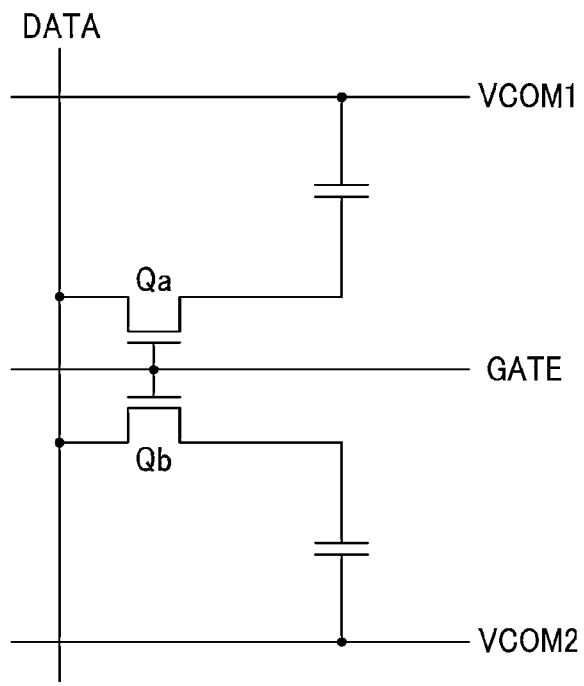
FIG. 10 is an equivalent circuit diagram for one pixel in the liquid crystal display according to the exemplary embodiment of FIG. 9.
Figure 11:
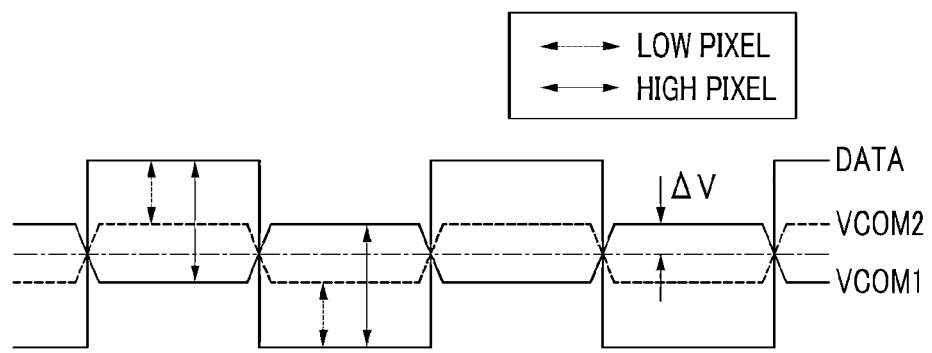
FIG. 11 is a graph illustrating one exemplary embodiment of a signal applying method in the exemplary embodiment of FIG. 9.
Figure 12A:
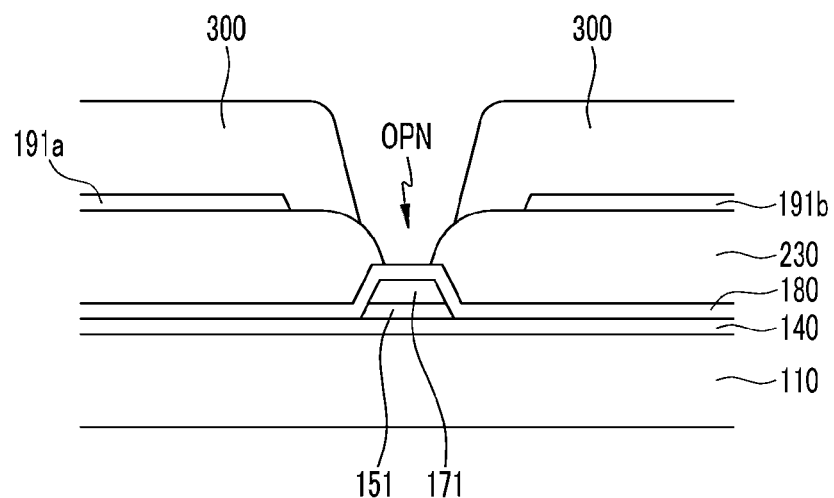
FIGS. 12A to 15C are cross-sectional views illustrating a manufacturing method of a liquid crystal display according to an exemplary embodiment of the present invention.
Figure 12B:
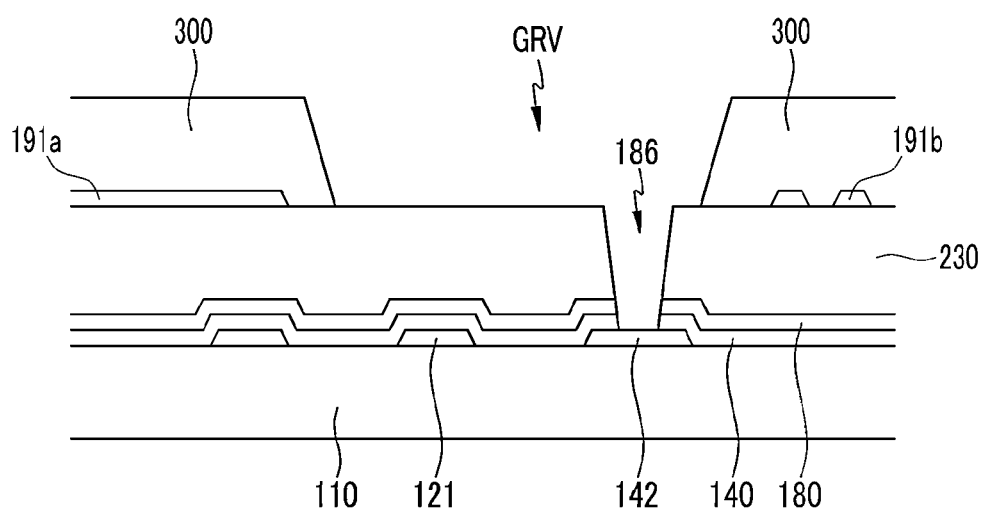
Figure 12C:
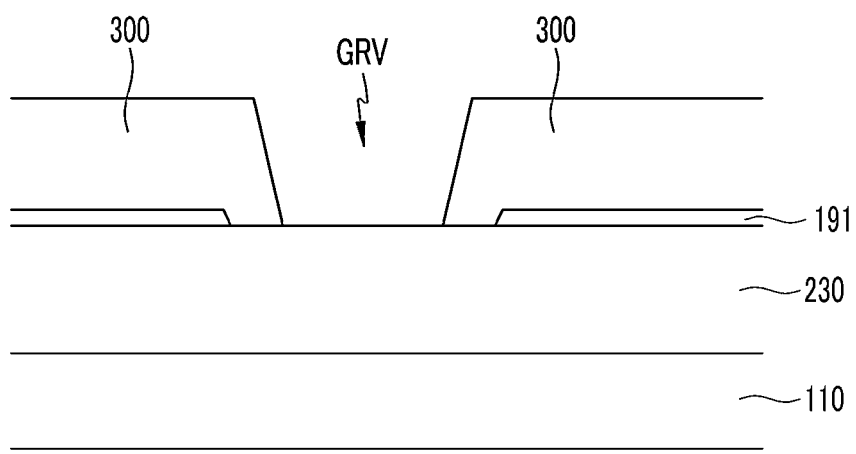
Figure 13A:
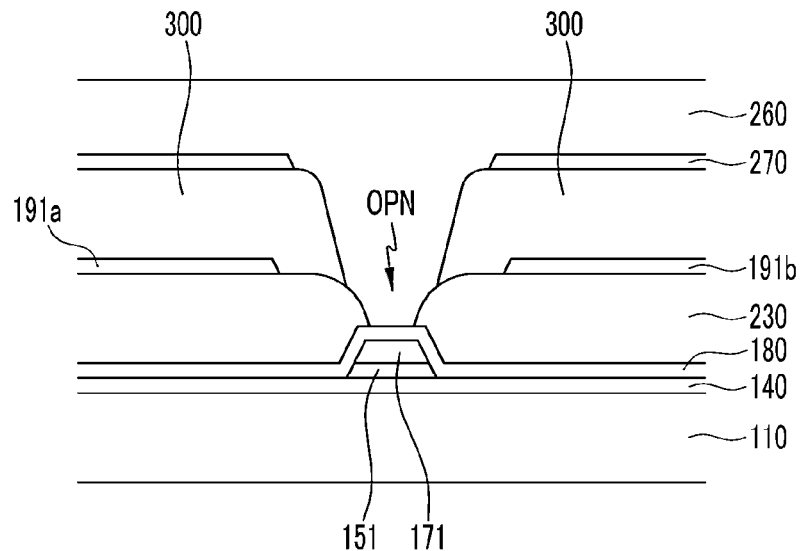
Figure 13B:
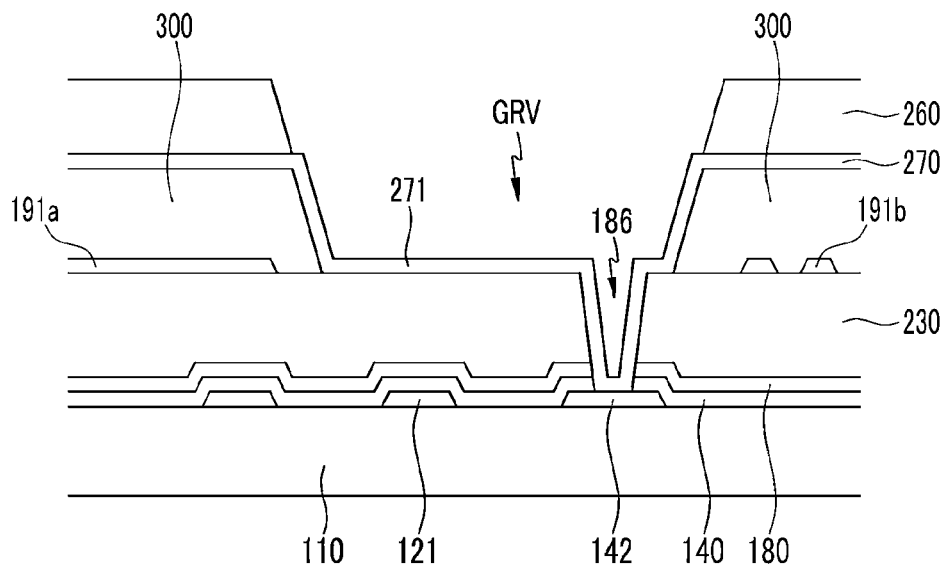
Figure 13C:
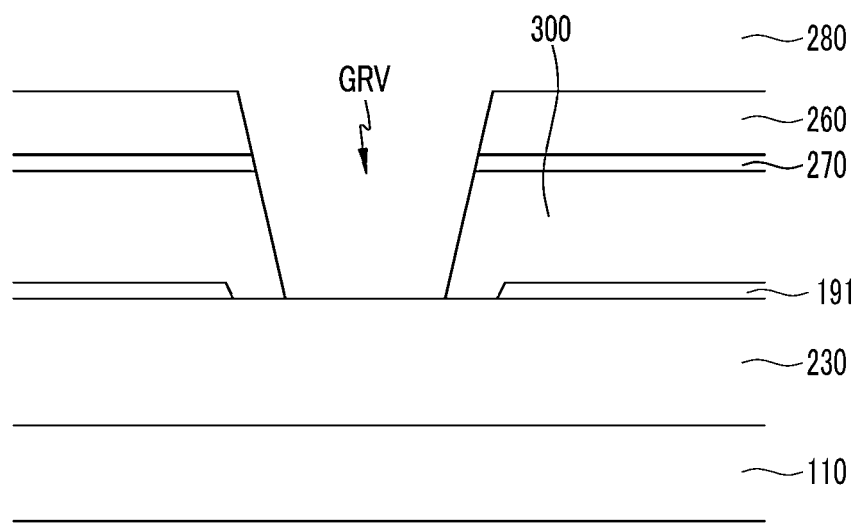
Figure 14A:
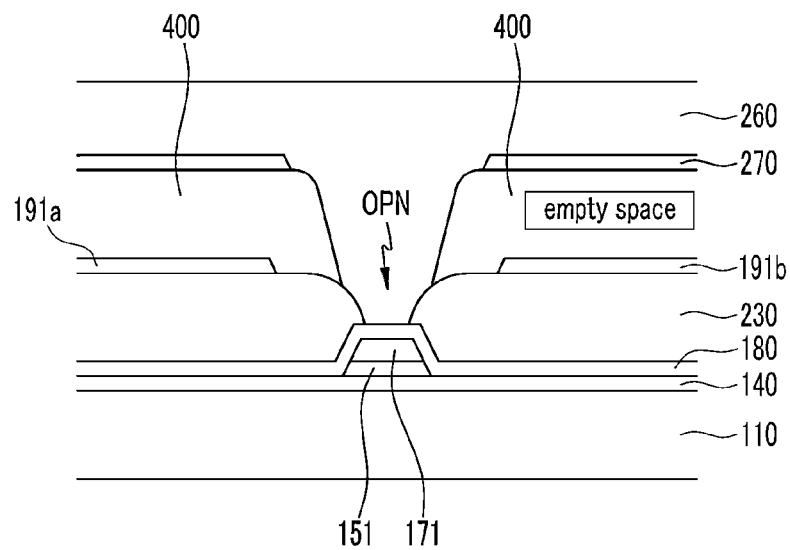
Figure 14B:
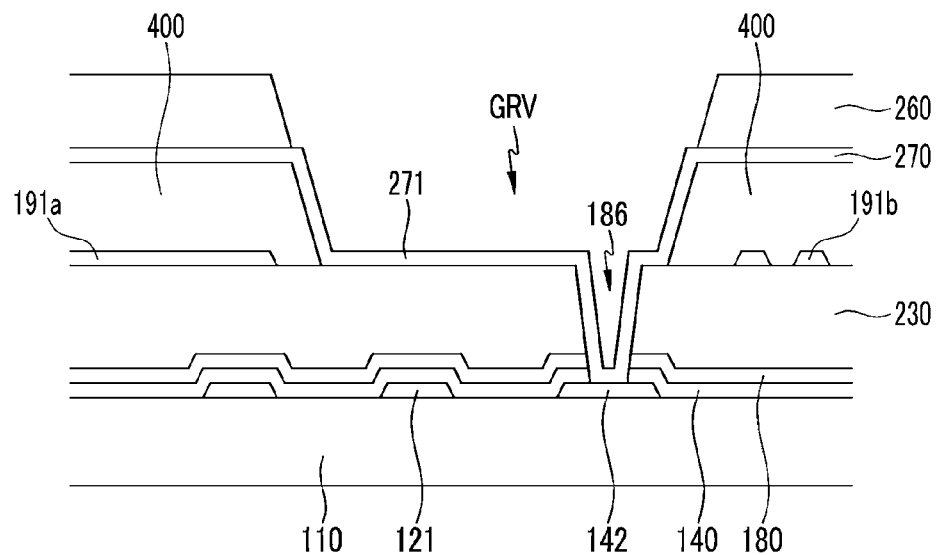
Figure 14C:
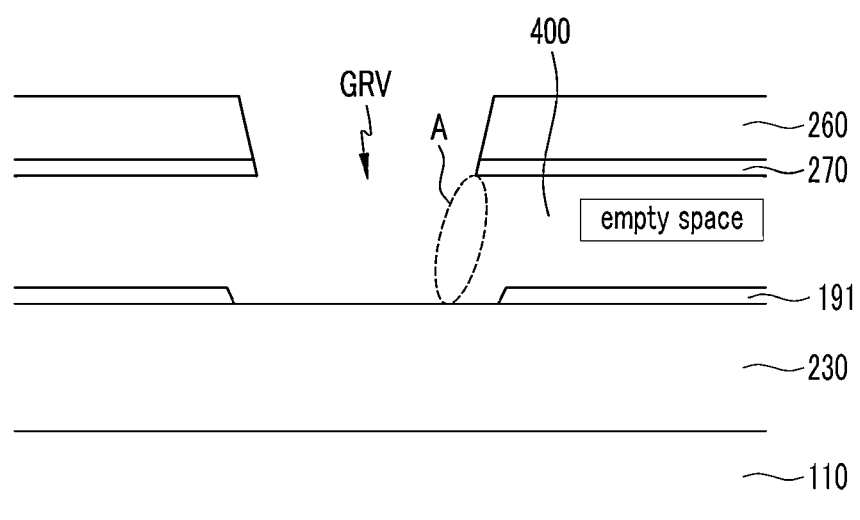
Figure 15A:
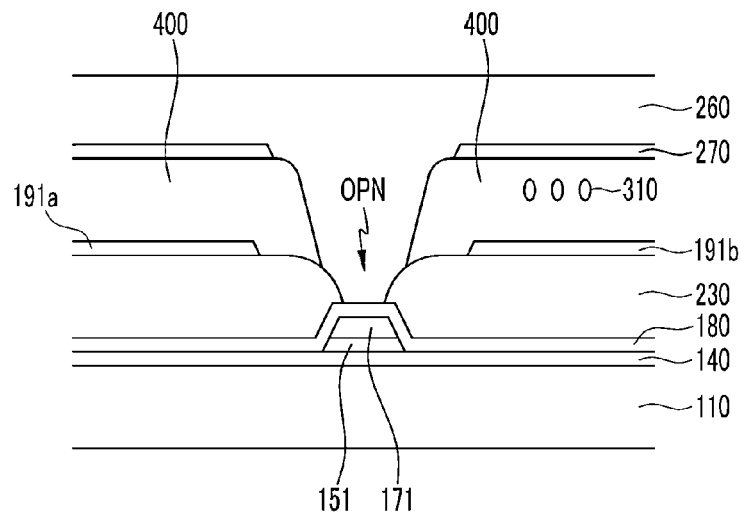
Figure 15B:
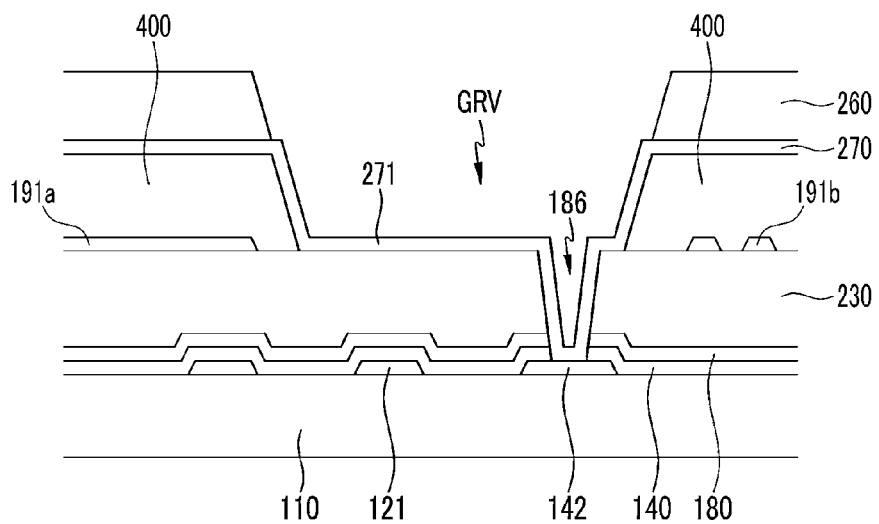
Figure 15C:
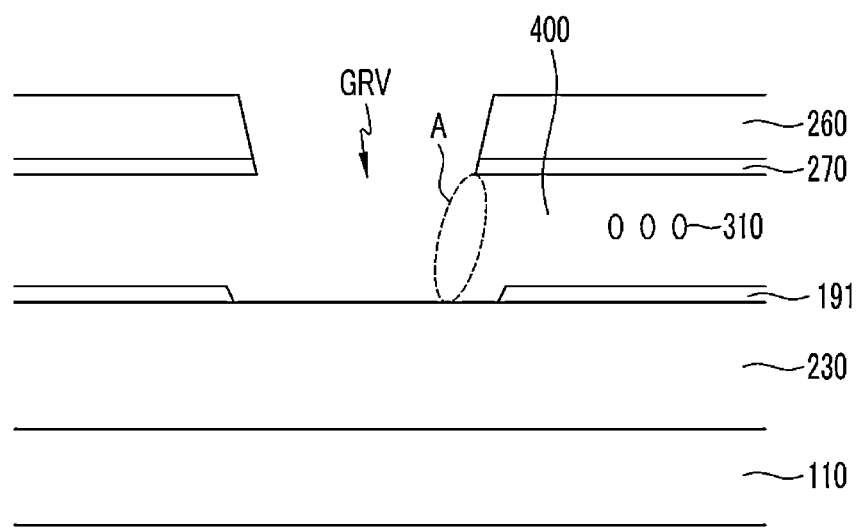

FIG. 9 is a plan view illustrating a liquid crystal display according to an exemplary embodiment of the present invention. FIG. 10 is an equivalent circuit diagram for one pixel in the liquid crystal display according to the exemplary embodiment of FIG. 9. FIG. 11 is a graph illustrating one exemplary embodiment of a signal applying method in the exemplary embodiment of FIG. 9.

The exemplary embodiment of FIGS. 9 and 10 illustrates a structure in which visibility is improved. The exemplary embodiment of FIGS. 9 and 10 is a liquid crystal display having an embedded microcavity structure like the exemplary embodiment of FIG. 1 described above, but has a difference in a structure of a thin film transistor for applying a signal to a pixel electrode.

Referring to FIGS. 9 and 10, the first subpixel electrode 191a and the second subpixel electrode 191b are disposed above and below the gate line 121, and a structure of the thin film transistor is formed between the first subpixel electrode 191a and the second subpixel electrode 191b. Hereinafter, a structure of the thin film transistor according to the exemplary embodiment will be described in detail.

The gate line 121 and common electrode lines 141a and 141b are formed on an insulation substrate. The common electrode lines 141a and 141b include a first common electrode line 141a formed above the gate line 121 and a second common electrode line 141b formed below the gate line 121. The first common electrode line 141a and the second common electrode line 141b include a first common electrode contact portion 142a and a second common electrode contact portion 142b, respectively. The gate line 121 includes a gate electrode 124 protruding from the gate line 121.

A gate insulating layer is formed so as to cover the gate line 121 and the common electrode lines 141a and 141b, and semiconductor layers 154a and 154b are formed on the gate insulating layer. On the gate insulating layer and the semiconductor layers 154a and 154b, the data line 171 is formed in a direction crossing the gate line 121, and a first source electrode 173a connected with the data line 171 and a second source electrode 173b connected to the first source electrode 173a, and a first drain electrode 175a and a second drain electrode 175b which correspond to the first source electrode 173a and the second source electrode 173b, respectively, are formed.

An organic layer is formed on the data line 171, the source electrodes 173a and 173b, and the drain electrode 175a and 175b, and the organic layer may be a color filter, and a first contact hole 185a and a second contact hole 185b for connecting the first drain electrode 175a and the second drain electrode 175b to the first subpixel electrode 191a and the second subpixel electrode 191b, respectively are formed in the organic layer.

Referring to FIGS. 9 and 10, in the exemplary embodiment, when a gate-on Von signal is applied to the gate line 121, the first switching element Qa and the second switching element Qb connected thereto are turned on and thus the same signal is applied to the first drain electrode 175a and the second drain electrode 175b through the source electrodes 173a and 173b connected to the same data line 171, and the subpixel electrode 191a and the second subpixel electrode 191b may receive the same signal.

The common electrode 270, the support member and the capping layer on the pixel electrodes 191a and 191b is the same as the exemplary embodiment of FIG. 1 and thus the description thereof is omitted.

In the exemplary embodiment, the common electrode 270 includes protrusions 271a and 271b so as to be overlapped with the common electrode contact portion 142a and 142b respectively. The first common electrode line 141a and an upper common electrode 270a are connected to each other and the second common electrode line 141b and a lower common electrode 270b are connected to each other, through the contact holes 186a and 186b which are formed by passing through the gate insulating layer and the organic layer. In this case, a voltage applied to the first common electrode 270a through the first common electrode line 141a and a voltage applied to the second common electrode 270b through the second common electrode line 141b may be set differently. Accordingly, a voltage between the first subpixel electrode 191a and the upper common electrode 270a and a voltage between the second subpixel electrode 191b and the lower common electrode 270b are different, thereby acquiring an improved effect on visibility.

In the exemplary embodiment, the common voltage signal applied through the first common electrode line 141a and the second common electrode line 141b may a pulse shape as shown in FIG. 11. In FIG. 11, a high pixel may correspond to the first subpixel electrode 191a, and a low pixel may correspond to the second subpixel electrode 191b.

Except for the difference due to the above structure of the thin film transistor, the contents described in the exemplary embodiment of FIG. 1 may be applied to the exemplary embodiment.

Hereinafter, a manufacturing method of a liquid crystal display according to an exemplary embodiment of the present invention will be described with reference to FIG. 1 and FIGS. 12A to 15C.

FIGS. 12A, 13A, 14A, and 15A are cross-sectional views of the liquid crystal display of FIG. 1 taken along line II-II, FIGS. 12B, 13B, 14B, and 15B are cross-sectional views of the liquid crystal display of FIG. 1 taken along line III-III, and FIGS. 12C, 13C, 14C, and 15C are cross-sectional views of the liquid crystal display of FIG. 1 taken along line IV-IV.

Referring to FIGS. 1, 12A, 12B, and 12C, the gate line 121, the storage electrode lines 131a and 131b and the common electrode line 141 are formed on the insulation substrate 110. The gate line 121, the storage electrode lines 131a and 131b and the common electrode line 141 are formed on the same layer and may be made of metals such as aluminum and copper.

The gate insulating layer 140 is formed so as to cover the gate line 121 and the common electrode line 141, and the semiconductor layers 154a, 154b, and 154c and the data conductors 173a, 173b, 173c, 175a, 175b, and 175c are formed thereon. The first contact hole 185a for connecting the storage electrode line 131a and the third source electrode 173c may be formed when the gate insulating layer 140 is formed.

The passivation layer 180 and the organic layer 230 are formed on the data conductors 173a, 173b, 173c, 175a, 175b, and 175c. The forming of the passivation layer 180 and the organic layer 230 includes forming the second contact hole 186 which exposes the upper surface of the common electrode line 141. In this case, the gate insulating layer 140 is partially patterned to form the second contact hole 186 together with the passivation layer 180 and the organic layer 230.

The pixel electrode 191 is formed on the organic layer 230, and a sacrificial layer 300 made of a photoresist and the like is formed on the pixel electrode. The sacrificial layer 300 is patterned to form a groove GRV in a parallel direction to the gate line 121 and form an open portion OPN in a substantially vertical direction to the groove GRV.

Referring to FIGS. 1, 13A, 13B, and 13C, the common electrode 270 and the support member 260 are sequentially formed on the sacrificial layer 300. In this case, the common electrode 270 is patterned to be removed from a portion corresponding to the groove GRV and the open portion OPN. However, the connecting part 271 for connecting an upper common electrode corresponding to the first subpixel electrode 191a and a lower common electrode corresponding to the second subpixel electrode 191b may be formed. The connecting part 271 is formed on the side wall of the sacrificial layer 300 exposed by the groove GRV to be connected with the common electrode contact portion 142 of the common electrode line 141 at the lower portion through the second contact hole 186.

The support member 260 may be formed on the entire surface of the sacrificial layer 300 and may be formed to fill the open portion OPN. However, the common electrode 270 and the support member 260 for ensuring a passage for removing the sacrificial layer 300 are removed from the portion overlapped with the groove GRV. However, if the passage for removing the sacrificial layer 300 can be ensured, a part of the common electrode 270 and the support member 260 may remain in the groove GRV.

Referring to FIGS. 1, 14A, 14B, and 14C, the sacrificial layer 300 is processed by $O_2$ ashing through the groove GRV and removed. In this case, the microcavity 400 having the liquid crystal injection hole A is formed. In this case, the microcavity 400 has an empty space in which the sacrificial layer 300 is removed. The liquid crystal injection hole A may be formed in a parallel direction to the gate line 121.

Referring to FIGS. 1, 15A, 15B, and 15C, an alignment layer (not shown) is formed on the pixel electrode 191 and the common electrode 270 by injecting an alignment material through the groove GRV and the liquid crystal injection hole A.

Next, the liquid crystal material 310 is injected into the microcavity 400 through the groove GRV and the liquid crystal injection hole A by using capillary force. Here, a height of the liquid crystal injection hole A may be slightly narrowed as compared with the originally formed liquid crystal injection hole A because the alignment layer is formed.

Thereafter, when the liquid crystal material 310 is injected, since the liquid crystal material 310 may be exposed outside through the liquid crystal injection hole A, the capping layer 280 is formed so as to cover the liquid crystal injection hole A to form the same structure as FIGS. 2, 3, and 4. In this case, the capping layer 280 is in contact with the upper surface and the side wall of the support member 260 and covers the liquid crystal injection hole A of the microcavity 400 exposed by the groove GRV. The capping layer 280 may be made of a thermosetting resin, silicon oxycarbide (SiOC), or graphene.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| <Description of symbols> | | | |
| --- | --- | --- | --- |
| 110 | Substrate | 191 | Pixel electrode |
| 230 | Organic layer | 260 | Support member |
| 270 | Common electrode | 280 | Capping layer |
| 300 | Sacrificial layer | 400 | Microcavity |

What is claimed is:

1. A liquid crystal display, comprising:
   a substrate;
   a gate line, a common electrode line and a data line formed on the substrate;
   an insulating layer formed on the gate line, the common electrode line and the data line;
   a pixel electrode formed on the insulating layer;
   a microcavity formed on the pixel electrode and including a liquid crystal injection hole;
   a common electrode formed on the microcavity;
   a support member formed on the common electrode; and
   a capping layer formed on the support member and covering the liquid crystal injection hole,
   wherein the common electrode line and the common electrode are connected to each other through a contact hole formed in a passivation layer.

2. The liquid crystal display of claim 1, wherein:
   the common electrode line extends parallel to the gate line.

3. The liquid crystal display of claim 2, wherein:
   the common electrode line is formed of a same layer as the gate line.

4. The liquid crystal display of claim 3, wherein:
   the microcavity contains a liquid crystal material.

5. The liquid crystal display of claim 1, wherein:
   the microcavity includes a plurality of regions corresponding to each pixel region, and grooves are formed between the plurality of regions of the microcavity, and the capping layer covers the grooves.

6. The liquid crystal display of claim 5, wherein:
   the grooves extend parallel to the gate line.

7. The liquid crystal display of claim 1, wherein:
   the insulating layer includes an inorganic layer and an organic layer formed on the inorganic layer, and the organic layer is a color filter.

8. The liquid crystal display of claim 1, wherein:
   the common electrode includes an upper common electrode, a lower common electrode, and a connecting part connecting the upper common electrode and the lower common electrode, and
   the connecting part is connected to the common electrode line through the contact hole.

9. The liquid crystal display of claim 1, wherein:
   the contact hole is formed at an edge of a pixel.

10. The liquid crystal display of claim 9, wherein:
    the contact hole is formed on an extension line of the data line.

11. The liquid crystal display of claim 10, wherein:
    the data line includes a portion that bypasses while surrounding the contact hole.

12. The liquid crystal display of claim 1, wherein:
    the pixel electrode includes a first subpixel electrode and a second subpixel electrode, the common electrode line includes a first common electrode line and a second common electrode line, the contact hole includes a first contact hole and a second contact hole, and the common electrode includes a first common electrode and a second common electrode,
    the first common electrode line is formed at an edge of the first subpixel electrode edge and connected with the first common electrode through the first contact hole, and
    the second common electrode line is formed at an edge of the second subpixel electrode edge and connected with the second common electrode through the second contact hole.

13. The liquid crystal display of claim 12, further comprising:
    a first drain electrode connected to the first subpixel electrode; and
    a second drain electrode connected to the second subpixel electrode,
    wherein the first drain electrode and the second drain electrode receive the same voltage through a source electrode connected to the data line.

14. The liquid crystal display of claim 13, wherein:
    a voltage applied to the first common electrode through the first common electrode line and a voltage applied to the second common electrode through the second common electrode line are different from each other.

15. The liquid crystal display of claim 14, wherein:
    the voltages applied to the first common electrode and the second common electrode have pulse shape.

16. A manufacturing method of a liquid crystal display, comprising:
    forming a gate line and a common electrode line on a substrate;
    forming a semiconductor layer on the substrate;
    forming a data line crossing the gate line on the substrate;
    forming an insulating layer on the gate line, the common electrode line, the semiconductor layer and the data line;
    forming a pixel electrode on the insulating layer;
    forming a sacrificial layer on the pixel electrode;
    forming a contact hole exposing the common electrode line by patterning the insulating layer;
    forming a common electrode formed on the sacrificial layer and connected to the common electrode line through the contact hole;
    forming a support member on the common electrode;
    forming a microcavity including a liquid crystal injection hole by removing the sacrificial layer;
    injecting a liquid crystal material into the microcavity; and
    forming a capping layer on the support member so as to cover the liquid crystal injection hole.

17. The manufacturing method of a liquid crystal display of claim 16, wherein:
    the common electrode line is formed to be parallel with an extending direction of the gate line.

18. The manufacturing method of a liquid crystal display of claim 17, wherein:

the grooves are formed to extend in a parallel direction with the gate line.

19. The manufacturing method of a liquid crystal display of claim 16, wherein:
the common electrode line is formed to be formed of a same layer as the gate line.

20. The manufacturing method of a liquid crystal display of claim 16, wherein:
the pixel electrode includes a first subpixel electrode and a second subpixel electrode, the common electrode line includes a first common electrode line and a second common electrode line, the contact hole includes a first contact hole and a second contact hole, and the common electrode includes a first common electrode and a second common electrode,
the first common electrode line is formed at an edge of the first subpixel electrode edge and connected with the first common electrode through the first contact hole, and
the second common electrode line is formed at an edge of the second subpixel electrode edge and connected with the second common electrode through the second contact hole.

\* \* \* \* \*